United States Patent [19]

Davis et al.

[11] Patent Number: 5,239,637
[45] Date of Patent: Aug. 24, 1993

[54] DIGITAL DATA MANAGEMENT SYSTEM FOR MAINTAINING CONSISTENCY OF DATA IN A SHADOW SET

[75] Inventors: Scott H. Davis, Merrimack; William L. Goleman, Nashua; David W. Thiel, Amherst, all of N.H.

[73] Assignee: Digital Equipment Corporation, Maynard, Mass.

[21] Appl. No.: 374,490

[22] Filed: Jun. 30, 1989

[51] Int. Cl.[5] .............................................. G06F 11/16
[52] U.S. Cl. .................................. 395/425; 364/243; 364/246.91; 364/259.2; 364/266.3; 364/268; 364/268.3; 364/268.5; 364/285.1; 364/943.9; 364/943.91; 364/943.92; 364/944.2; 364/145.6; 364/947.2; 364/164.9; 371/10.1; 371/10.2; 371/67.1; 371/69.1

[58] Field of Search ... 364/200 MS File, 900 MS File; 371/10.21, 10.1, 10.2, 67.1, 68.1, 69.1; 307/441; 395/425

[56] References Cited

U.S. PATENT DOCUMENTS

| | | | |
|---|---|---|---|
| 3,544,777 | 12/1970 | Winkler | 235/153 |
| 3,668,644 | 6/1972 | Looschen | 340/172.5 |
| 4,199,810 | 4/1960 | Gunckil | 364/200 |
| 4,432,057 | 2/1984 | Daniell et al. | 364/300 |
| 4,467,421 | 8/1984 | White | 364/200 |
| 4,476,526 | 10/1984 | Dodd | 364/200 |
| 4,503,534 | 3/1985 | Budde et al. | 371/9 |
| 4,584,681 | 4/1986 | Singh et al. | 371/10 |
| 4,600,990 | 7/1986 | Gershenson et al. | 364/200 |
| 4,602,368 | 7/1986 | Circello et al. | 371/21 |
| 4,603,406 | 7/1986 | Miyazaki et al. | 365/229 |
| 4,608,687 | 8/1986 | Dutton | 371/10 |
| 4,608,688 | 8/1986 | Hansen | 371/11 |
| 4,616,312 | 10/1986 | Uebel | 364/200 |
| 4,617,475 | 10/1986 | Reinschmidt | 307/441 |
| 4,636,946 | 1/1987 | Hartung et al. | 364/200 |
| 4,638,424 | 1/1987 | Beglin et al. | 364/200 |
| 4,654,819 | 3/1987 | Stiffler et al. | 364/900 |
| 4,686,620 | 9/1987 | Ng | 364/200 |
| 4,688,219 | 8/1987 | Takamae | 371/10 |
| 4,710,870 | 12/1987 | Blackwell et al. | 364/200 |
| 4,747,038 | 5/1988 | Bradley et al. | 364/200 |
| 4,750,106 | 6/1988 | Aiken, Jr. | 364/200 |
| 4,751,639 | 6/1988 | Corcoran et al. | 364/200 |
| 4,755,928 | 7/1988 | Johnson | 364/200 |
| 4,768,193 | 8/1988 | Takamae | 371/10 |
| 4,771,375 | 9/1988 | Beglin et al. | 364/200 |
| 4,805,095 | 2/1989 | Armstrong et al. | 364/200 |
| 4,814,971 | 3/1989 | Thatte | 364/200 |
| 4,819,154 | 4/1989 | Stiffler et al. | 364/200 |
| 4,916,605 | 4/1990 | Beardsley | 364/200 |
| 4,959,774 | 9/1990 | Davis | 364/200 |
| 5,060,185 | 10/1991 | Naito et al. | 364/900 |
| 5,089,958 | 2/1992 | Horton et al. | 395/575 |

FOREIGN PATENT DOCUMENTS

| | | |
|---|---|---|
| 026980 | 4/1981 | European Pat. Off. |
| 2188177 | 9/1977 | United Kingdom |

OTHER PUBLICATIONS

Haskin, "Virtual Disk Casts a Long Shadow" (Aug. 1988), pp. 49-52.
Research Disclosures No. 296, Dec. 1988, New York, N.Y., U.S.; RD 29647 (Anonymous): "Data Integrity During Mirror Synchronisation".
Patent Abstracts of Japan, JP-A-59201297, Nov. 14, 1984.

Primary Examiner—Joseph L. Dixon
Assistant Examiner—B. James Peikari
Attorney, Agent, or Firm—Fish & Richardson

[57] ABSTRACT

A digital data management system for managing a shadow set of storage media includes a plurality of storage media each accessible by at least one data processing device for I/O operations. Successive comparisons are carried out between data stored in corresponding locations in the storage media while maintaining access to the storage media for I/O operations. When inconsistency between data in corresponding locations is detected, a management operation is performed on at least one of the shadow set storage media. The management operation includes interrupting I/O operations to at least the storage medium on which the operation is performed, modifying data on one of the shadow set storage media to correct the inconsistency, and resuming availability of the storage media for I/O operations.

30 Claims, 8 Drawing Sheets

WRITE COMMAND MESSAGE FORMAT

| COMMAND REFERENCE NUMBER ||| |
|---|---|---|---|
| RESERVED || UNIT NUMBER ||
| MODIFIERS | RESERVED || OPCODE |
| BYTE COUNT ||||
| BUFFER ||||
| DESCRIPTOR ||||
| LOGICAL BLOCK NUMBER ||||
| HOST REF/ENTRY LOC ||| ENTRY I.D. |

FIG. 2A

READ COMMAND MESSAGE FORMAT

| COMMAND REFERENCE NUMBER ||| |
|---|---|---|---|
| RESERVED || UNIT NUMBER ||
| MODIFIERS | RESERVED || OPCODE |
| BYTE COUNT ||||
| BUFFER ||||
| DESCRIPTOR ||||
| LOGICAL BLOCK NUMBER ||||

FIG. 2B

FIG. 3A WRITE END MESSAGE FORMAT

| COMMAND REFERENCE NUMBER ||
|---|---|
| SEQUENCE NUMBER | UNIT NUMBER |
| STATUS / FLAGS | END CODE |
| BYTE COUNT ||
| UNDEFINED ||
| FIRST BAD BLOCK ||
| ENTRY LOCATOR | ENTRY I.D. |

FIG. 3B READ END MESSAGE FORMAT

| COMMAND REFERENCE NUMBER ||
|---|---|
| SEQUENCE NUMBER | UNIT NUMBER |
| STATUS / FLAGS | END CODE |
| BYTE COUNT ||
| UNDEFINED ||
| FIRST BAD BLOCK ||

FIG. 4 WRITE HISTORY ENTRY FORMAT

| RESERVED | ENTRY FLAGS |
|---|---|
| RESERVED | UNIT NUMBER |
| COMMAND IDENTIFIER/STATUS ||
| TRANSFER LENGTH ||
| STARTING LOGICAL BLOCK NO. ||
| HOST REFERENCE NUMBER ||
| ENTRY LOCATOR | ENTRY I.D. |

WRITE HISTORY MANAGEMENT COMMAND MESSAGE FORMAT

| COMMAND REFERENCE NUMBER ||| |
|---|---|---|---|
| RESERVED || UNIT NUMBER ||
| MODIFIERS | RESERVED || OPCODE |
| COUNT || OPERATION ||
| WRITE HISTORY BUFFER DESCRIPTOR ||||
| RESERVED ||||
| HOST REFERENCE NUMBER ||||
| ENTRY LOCATOR ||| ENTRY I.D. |

FIG. 5A

WRITE HISTORY MANAGEMENT END MESSAGE FORMAT

| COMMAND REFERENCE NUMBER ||||
|---|---|---|---|
| SEQUENCE NUMBER ||| UNIT NUMBER |
| STATUS | FLAGS || END CODE |
| COUNT || OPERATION ||
| SERVER ALLOC. || UNIT ALLOC. ||
|  | SERVER UNALLOC. |||
| UNDEFINED ||||
| HOST REFERENCE NUMBER ||||
| ENTRY LOCATOR ||| ENTRY I.D. |

FIG. 5B

HOST COMPARE COMMAND FORMAT

| COMMAND REFERENCE NUMBER | | |
|---|---|---|
| RESERVED | UNIT NUMBER | |
| MODIFIERS | RESERVED | OPCODE |
| BYTE COUNT | | |
| BUFFER DESCRIPTOR | | |
| LOGICAL BLOCK NUMBER | | |

FIG. 6A

HOST COMPARE END MESSAGE FORMAT

| COMMAND REFERENCE NUMBER | | |
|---|---|---|
| SEQUENCE NUMBER | UNIT NUMBER | |
| STATUS | FLAGS | END CODE |
| BYTE COUNT | | |
| UNDEFINED | | |
| FIRST BAD BLOCK | | |

FIG. 6B

DIGITAL DATA MANAGEMENT SYSTEM FOR MAINTAINING CONSISTENCY OF DATA IN A SHADOW SET

RELATED APPLICATIONS

This application is related to the following applications, all of which are filed concurrently herewith, and each of which is incorporated herein by reference: U.S. patent application Ser. No. 07/374,551, in the name of Scott H. Davis, William L. Goleman and David W. Thiel, Robert G. Bean and James A Zahrobsky, and entitled DATA STORAGE DEVICE FOR A DIGITAL DATA PROCESSING SYSTEM; U.S. patent application Ser. No. 07/374,528, in the name of Scott H. Davis, William L. Goleman and David W. Thiel, and entitled Transferring Data In A Digital Data Processing System, and U.S. patent application Ser. No. 07/374,253, in the name of Scott H. Davis, William L. Goleman, David W. Thiel, Robert G. Bean and James A Zahrobsky, and entitled Transferring Data In A Digital Data Processing System.

BACKGROUND OF THE INVENTION

This invention relates to a device for storing digital data. The preferred embodiment is described in connection with a system for establishing and maintaining one or more duplicate or "shadow" copies of stored data to thereby improve the availability of the stored data.

A typical digital computer system includes one or more mass storage subsystems for storing data (which may include program instructions) to be processed. In typical mass storage subsystems, the data is actually stored on disks. Disks are divided into a plurality of tracks, at selected radial distances from the center, and sectors, defining particular angular regions across each track, with each track and set of one or more sectors comprising a block, in which data is stored.

Since stored data may be unintentionally corrupted or destroyed, systems have been developed that create multiple copies of stored data, usually on separate storage devices, so that if the data on one of the devices or disks is damaged, it can be recovered from one or more of the remaining copies. Such multiple copies are known as the shadow set. In a shadow set, typically data that is stored in particular blocks on one member of the shadow set is the same as data stored in corresponding blocks on the other members of the shadow set. It is usually desirable to permit multiple host processors to simultaneously access (i.e., in parallel) the shadow set for read and write type requests ("I/O" requests).

It is sometimes necessary to "merge" two (or more) storage devices to reassemble a complete shadow set, where the devices were previously members of the same shadow set, but currently contain data that is valid, although possibly inconsistent. Data in a particular block is valid if it is not erroneous, that is, if it is correct, as determined by an error correction technique, or, if it is incorrect but correctable with use of the error correction technique. Shadow set members have data that is inconsistent if they have corresponding blocks whose data contents are different. For example, if one of the hosts malfunctions (e.g., fails), it may have had outstanding writes that completed to some shadow set members but not to others, resulting in data that is inconsistent. A merge operation ensures that the data stored on corresponding blocks of the shadow set members are consistent but does not determine the integrity (i.e., accuracy) of the data stored in the blocks which were inconsistent. The integrity of the data is verified by higher level techniques (e.g., by an applications program).

SUMMARY OF THE INVENTION

The invention generally features a method and apparatus for performing a management operation in a data storage device, the preferred embodiment describing an improved method and apparatus for merging the data of two storage media (e.g., hard disks) in a shadow set of storage media. The preferred method of managing a shadow set of storage media accessible by one or more data sources (e.g. host processors) for I/O operations, includes the steps of: A. carrying out successive comparisons of data stored in corresponding locations in a plurality of shadow set storage media, respectively, while maintaining access to the storage media by the data sources for I/O operations; and B. performing a management operation on at least one of the shadow set storage media. The management operation preferably includes the steps of: (a) interrupting I/O operations to at least the shadow set storage medium on which the management operation is performed; (b) modifying data on the shadow set storage medium whose I/O is interrupted, based on the results of the comparisons performed in step A; and (c) resuming the availability of the modified storage medium for I/O operations by the data sources.

In the preferred embodiment, the step of modifying comprises making data on the modified storage medium consistent with data on another of the shadow set storage media, by reading data from one of the storage media and writing the read data to the modified storage medium. The shadow set storage media are accessible by a plurality of data sources.

The invention allows inconsistencies in duplicate copies of stored data to be corrected while maximizing the availability of the data in the various copies comprising the shadow set during the correction process. Maximum availability is achieved since I/O operations, initiated by the hosts, are interrupted only when an inconsistency is found, and only for a period long enough to correct the inconsistency.

Other advantages and features of the invention will be apparent from the following detailed description of the invention and the appended claims.

DESCRIPTION OF THE PREFERRED EMBODIMENTS

Drawings

We first briefly describe the drawings.

FIGS. 2A, 2B, 3A, 3B, 4, 5A, 5B, 6A illustrate data structures used with the invention.

STRUCTURE AND OPERATION

Figure 1:
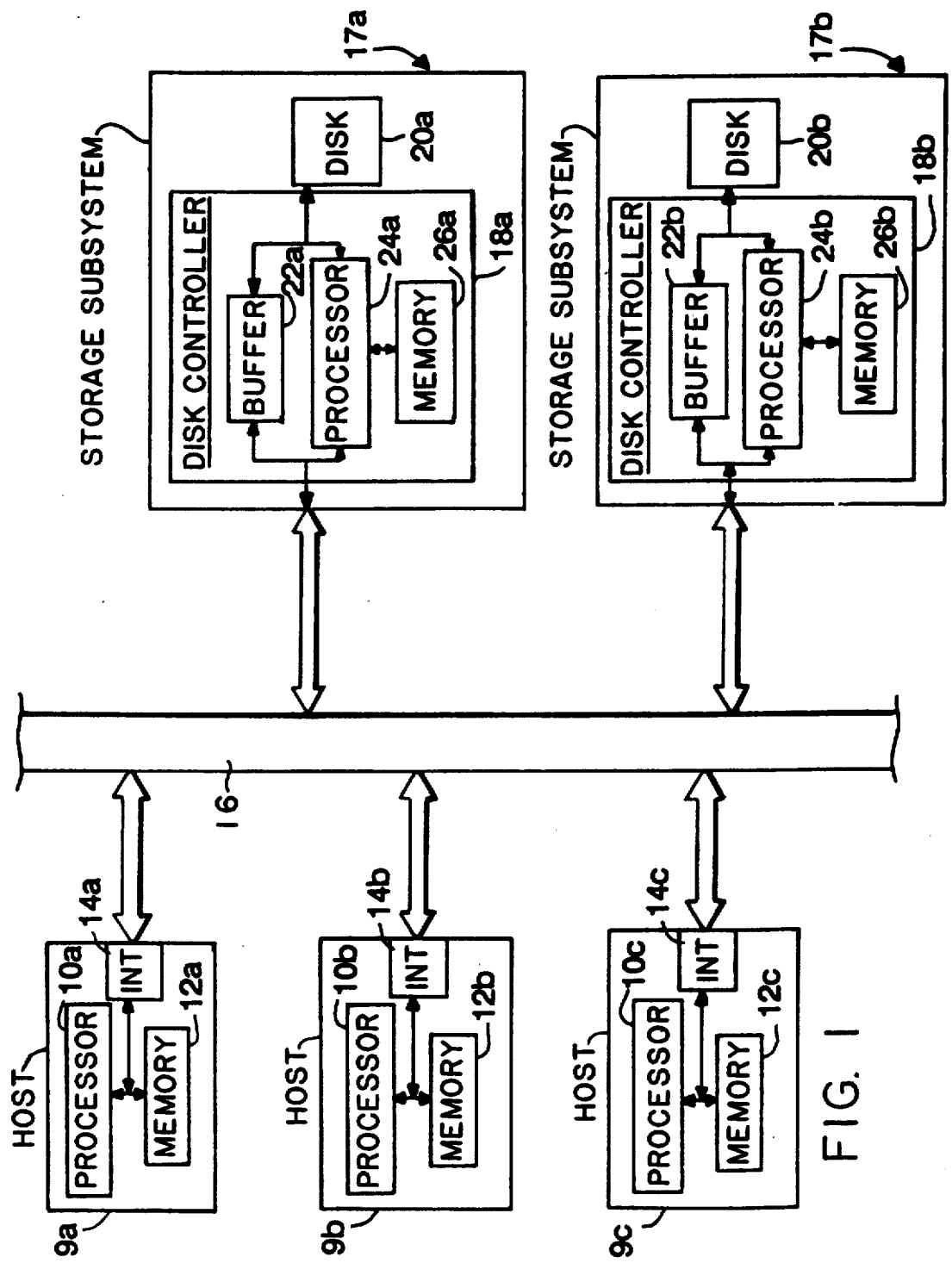
FIG. 1 is a system according to the present invention using a shadow set.

Referring to FIG. 1, a computer system including the invention includes a plurality of hosts 9a–c, each of which includes a processor 10, memory 12 (including buffer storage) and a communications interface 14. The hosts 9a–c are each directly connected through a communications medium 16 (e.g., by a virtual circuit) to two or more storage subsystems illustrated generally identified by reference numerals 17a-b (two are shown).

Each storage subsystem 17a-b includes a disk controller 18 that controls one or more disks 20, which form the members of the shadow set. Disk controller 18 includes a buffer 22, a processor 24 and memory 26 (e.g., volatile memory). Processor 24 receives I/O requests from hosts 9a-c and controls reads from and writes to disk 20. Buffer 22 temporarily stores data received in connection with a write command before the data is written to a disk 20. Buffer 22 also stores data read from a disk 20 before the data is transmitted to the host in response to a read command. Processor 24 stores various types of information in memory 26, described more fully below.

Each host 9a-c will store, in its memory 12, a table that includes information about the system that the hosts 9a-c need to perform many operations. For example, hosts 9a-c will perform I/O operations to storage subsystems 17a-b and must know which storage subsystems are available for use, what disks are stored in the subsystems, etc. As will be described in greater detail below, the hosts 9a-c will slightly alter the procedure for I/O operations if a merge operation is being carried out in the system by a particular host 9a-c. Therefore, the table will store status information regarding any ongoing merge operation (as well as other operations). The table also contains other standard information.

While each storage subsystem may include multiple disks 20, the members of the shadow set are chosen to include disks in different storage subsystems 17a-b. Therefore, a host may directly access each member of the shadow set, through its interface 14 and over communication medium 16, without requiring it to access two shadow set members through the same disk controller 18. This will avoid a "single point of failure" in the event of a failure of one of the disk controllers 18a-b. In other words, if members of a shadow set have a common disk controller 18, and if that controller 18 malfunctions, the hosts will not be able to successfully perform any I/O operations. In the preferred system, the shadow set members are "distributed", so that the failure of one device (e.g., one disk controller 18) will not inhibit I/O operations because they can be performed using another shadow set member accessed through another disk controller.

In some cases a host 9 initiates a merge operation in which it makes data on two disks 20 comprising members of a shadow set consistent. In a merge operation, the host 9 initiates by means of write and read commands, read and write operations. Before proceeding further, it will be helpful to describe these commands in greater detail.

When a host 9 wishes to write data to a disk 20, which may comprise a member of a shadow set, the host issues a command whose format is illustrated in FIG. 2A. The command includes a "command reference number" field that uniquely identifies the command, and a "unit number" field that identifies the unit (e.g. the disk 20) to which data is to be written. To accomplish write operations for each disk 20 comprising a member of the shadow set, the host issues a separate write command to each disk 20 with the proper unit number that identifies the disk 20. The "opcode" field identifies that the operation is a write. The "byte count" field contains a value that identifies the total number of bytes comprising the data to be written and the "logical block number" identifies the starting storage location on the disk at which the data is to be written. The "buffer descriptor" identifies the location in host memory 12 that contains the data to be written.

The "host reference number," "entry locator" and "entry id" are used in connection with a "write log" feature, described in detail below.

The format of a read command is illustrated in FIG. 2B, and includes fields that are similar to the write command fields. For a read command, the buffer descriptor contains the location in host memory 12 where the data read from the disk is to be stored. The read command does not include the fields in the write command that are associated with the write log feature, namely, the host reference number field, entry locator field, and entry ID field (FIG. 2A).

Once a host transmits a read or write command, it is received by the disk controller 18 that serves the disk 20 identified in the "unit number" field. For a write command, the disk controller 18 will perform the write operation in connection with the identified disk 20 and return an "end message" to the originating host 9. The format of the write command end message is illustrated in FIG. 3A. The end message includes a number of fields, including a command reference number field whose contents correspond to the contents of the command reference number field of the write command which initiated storage operation, and status field that informs the host whether or not the command was completed successfully. If the disk 20 was unable to complete the write operation, the status field can include an error code identifying the nature of the failure.

In response to a read command, the disk controller 18 will read the requested data from its disk 20 and transmit the data to memory 12 of the originating host. After the data has been transmitted, an end message is generated by the disk controller and sent to the originating host, the format of the read command end message being illustrated in FIG. 3B. The read command end message is similar to the end message for the write command, with the exception that the read command end message does not include an entry locator or entry ID field associated with the write history log feature, described below.

The disk controller 18 also maintains a write history log that includes a number of "write history entries" (FIG. 4), each of which stores information regarding a recent write operation. As described above, each of the storage subsystems that form each shadow set member includes a processor 24 and an associated memory 26. When a write operation is performed to a shadow set member, its disk controller 18 stores, in a write history log in its memory 26, information in a write history entry indicating the data blocks of the shadow set member to which data has been written. The write history entry also stores information identifying the source of the write command message (e.g., the originating host) which initiated the write operation.

Thereafter, if a merge operation becomes necessary, a host 9 managing the merge operation accesses the write history log for each shadow set member engaged in the merge operation and determines from the log entries which data blocks may be inconsistent. For example, if one of hosts 9 in FIG. 1 should fail while initiating write operation to members of the shadow set, one shadow set member may have completed the write operation but not another shadow set member, leaving the data on the shadow set inconsistent to the extent of the one write operation. Therefore, merge operation may be performed by a properly functioning host, but it need only be performed for the data blocks that the failed host has recently enabled to be written because other data blocks will be consistent. Therefore, the host performing the merge operation will access the write history log associated with each member of the shadow set, determine which blocks have been written by the host that failed, and perform a merge on corresponding blocks in the shadow set. Since only the blocks that were written in the shadow set are merged, the operation is completed much more quickly than if a host managing a merge operation enabled the contents of an entire shadow set member to be copied to another shadow set member.

We will first describe how the write history log is created and maintained and then will describe how this information is utilized in a merge operation. When a write command is received by one of the disk controllers 18, the disk controller prepares and stores a write history entry in its memory 26. The format of a write history entry is shown in FIG. 4. The "entry flags" indicate the state of a write history entry. An "Allocated" flag is set if the write history entry is currently allocated (i.e., being used to store information about a write operation). The contents of a "unit number" field identify the specific disk to which the write operation associated with the write history entry was addressed. A "command identifier/status" field is used to identify and give the status of a current command (examples of the information stored in this field are described below).

The "starting logical block number" gives the address (position) on the disk volume at which the associated write operation begins and the "transfer length" specifies the number of bytes of data written to the member's disk. I.e., these fields specify what part of the shadow set member has been potentially modified. The "host reference number" field identifies the host from which the write operation originated.

The "entry id" field contains a value assigned by a host to uniquely identify a write history entry.

The "entry locator" field contains a value assigned by the shadow set member that uniquely identifies the internal location of the write history entry, i.e., the location within memory 26.

When a shadow set disk controller 18 receives a write command from a host, the controller performs the following operations. First, the controller validates the command message fields and checks the state of the disk 20 to perform the write operation in a standard manner for the protocall being used. If the field validation or state checks fail, the shadow set member rejects the command issuing a write end message (FIG. 3A) whose status field contains the appropriate status.

The controller then checks a flag in the write command that indicates the contents of whether a new write history entry for the command is to be allocated or whether a previously allocated write history entry will be reused. If a new write history entry is to be allocated, the "Host Reference Number/entry locator" field will contain the Host reference number. The controller will search the set of write history entries in memory 26 for an entry that is not currently allocated—i.e., a write history entry with a clear "allocated entry" flag.

If an unallocated write history entry cannot be found, the controller 18 completes the command and sends an end message to the host whose "status" field indicates that the write history log is invalid with respect to that host. The controller will also invalidate all write history entries for the host that issued the write command in order to prevent another host from relying on these entries in a merge operation. The entries can be invalidated by using a "history log" modifier contained in each entry that indicates whether that entry is valid or invalid.

If an unallocated write history entry is found, the controller 18 performs the following operations in connection with the write history entry:

a. Sets the "allocated entry flag".
b. Copies the contents of the command message's "unit number" field to the entry s "unit number" field.
c. Copies the contents of the command message s "opcode" and "modifiers" fields to the entry's "command id/status" field.
d. Copies the contents of the command message s "byte count" (or "logical block count") field to the entry's "transfer length" field.
e. Copies the contents of the command message s "logical block number" (or "destination lbn") field to the entry's "starting logical block number" field.
f. Copies the contents of the command message's "host reference number" field to the entry's "host reference number" field.
g. Copies the contents of the command message's "entry id" field to the entry's "entry id" field.
h. Continues normal processing of the command.

If a previously used write history entry is to be reused, then the "Host Reference number/ entry locator" field will contain the "entry locator" that defines the location of the write history entry to be used. This may occur if, for example, a host 9 is re transmitting a previous write command message, which will have the same value in the "host reference number" field. To accomplish this, the controller 18 will first determine if the value contained in the "entry locator" field identifies one of the set of write history entries in its write log. If the contents of the "entry locator" field does not identify an entry in the set, the controller 18 rejects the command as an invalid command. If the contents of the "entry locator" identifies one of the entries in the set of write history entries, the disk controller 18 uses the value in the "entry locator" field as an index into the set of write history entries to find the write history entry to be reused. The controller then checks the setting of the allocate entry flag of the found write history entry. If that flag is clear, indicating that the entry was not actually already allocated, the controller 18 rejects the command with a status of Write History Entry Access Error.

The controller then checks the "command identifier/status" field of the identified write history entry to see if the entry is currently associated with an in progress command such as a write command that is being carried out—i.e., the controller determines if an "encode" flag within the "opcode" field is clear. The encode flag is set when an operation begins and is cleared when the operation completes. If the entry is associated with an in progress command, the controller rejects the command and sends an end message to the host whose status field identifies a Write History Entry Access Error.

Finally, if the entry is not associated with an in progress command, the controller performs the following operations:

a. Copies the contents of the command's command message "unit number" field to the entry's "unit number" field.

b. Copies the contents of the command's command message "opcode" and "modifiers" fields to the entry's "command id/status field.
c. Copies the contents of the command's command message "byte count" (or "logical block count") field to the entry's "transfer length" field.
d. Copies the contents of the command's command message "logical block number" (or "destination lbn") field to the entry's "starting logical block number" field.
e. Continues normal processing of the command.

After a write command has aborted, terminated, or completed, the disk controller copies the "encode," "flags," and "status" end message fields into the appropriate fields of the write history entry associated with the command and then continues standard processing.

In addition, prior to returning the end message of a write command, the disk controller sets the "host reference number," "entry id," and "entry locator" end message fields equal to the values contained in the corresponding fields of the write history entry associated with the command. Note that with one exception the requirement just described can also be met by copying those fields directly from the command message to the end message. The only exception is that when a new write history entry has been allocated, the controller must set the "entry locator" end message field equal to the value contained in the "entry locator" field of the associated write history entry.

As will be explained below, the system utilizes a "Compare Host" operation in performing a merge of two shadow set members. The command message format for the Compare Host operation is shown in FIG. 6A. The Compare Host operation instructs the disk controller supporting the disk identified in the "unit number" field to compare the data stored in a section of host memory identified in the "buffer descriptor" field, to the data stored on the disk in the location identified by the "logical block number" and "byte count" fields.

The disk controller receiving the Compare Host command will execute the requested operation by reading the identified data from host memory, reading the data from the identified section of the disk, and comparing the data read from the host to the data read from the disk. The disk controller then issues an end message, the format of which is shown in FIG. 6B, to the host that issued the Compare Host command. The status field of the end message will indicate whether the compared data was found to be identical.

One of the system's hosts will control operations for merging two storage devices. The system can select any host to execute the operation. For example, the host with the best transmission path (e.g., the shortest path) to the shadow set may be chosen.

During a merge operation, the host controlling the merge will utilize a "Write History Management" command to perform a number of operations. The command message format (i.e., the message sent by the host to the shadow set) of a Write History Management command is shown in FIG. 5A. FIG. 5B illustrates the end message format (i.e., the message returned to the host by a shadow set member s disk controller ). The host selects a particular operation as the operations are needed during the merge, and specifies the operation in the "operation" field of the command message. The other fields contain other information, explained more fully below as each operation is explained.

The "DEALLOCATE ALL" operation is used to deallocate all of the write history entries for the disk identified in the "unit number" field. The DEALLOCATE ALL operation makes all of the write log spaces available for new entries. For example, after a merge operation is performed, the entries stored in the write history log are no longer needed because the members are assumed to be consistent immediately following a merge. The DEALLOCATE ALL operation will deallocate (i.e. free up) all of the write history entries to make them available for new information as new writes are made to the shadow set.

A host can deallocate only those write log entries associated with a particular host using a "DEALLOCATE BY HOST REFERENCE NUMBER" operation. This may be desirable if a merge was performed as a result of a particular host having failed. Such a merge, as described more fully below, would involve merging only those blocks that were written with information from the failed host. Once that merge is completed, the write history entries associated with that host will no longer be needed and may be deallocated. All write history entries are not deallocated because if a different host fails, its entries would be needed to perform a similar merge. To execute this operation, each disk controller deallocates all of the write history entries that are associated with the host identified in the "host reference number" field for the disk identified in the "unit number" field.

A specific write history entry can be deallocated using a "DEALLOCATE BY ENTRY LOCATOR" operation. The disk controller deallocates the specific write history entry that is located within the write log at the location specified in the "entry locator" field. If the contents of the entry locator field does not specify an entry within the limits of the write history log (i.e., if there is no write history entry at the identified location), the command is rejected and an end message is returned as an invalid command. If the value contained in the "host reference number" field of the write history entry identified by the entry locator does not equal the value contained in the command message "host reference number" field (i.e., if the host identified in the command is also not the same as the host identified in the write history entry), the command is rejected as an invalid command. Similarly, if the value contained in the "entry id" field of the write history entry located via the "entry locator" does not equal the value contained in the command message "entry id" field, the controller rejects the command as an invalid command.

The "READ ALL" operation is used to read information from the write log of a shadow set member supporting the disk identified in the unit number field. If a host wishes to determine the total number of write history entries stored in the write log, the "count" field is set to zero, and the disk controller sets the command's end message "count" field (see FIG. 6B) equal to the number of write history entries that are associated with the identified unit.

The READ ALL operation is also used to read all of the write log entries from an identified shadow set member. In this case, the "count" field is nonzero, and the disk controller transfers the number of the write history entries specified in the "count" field to the host memory 12 (specified in the "write history buffer descriptor" field) beginning with the first write history entry. Note that only those write history entries that are associated with the unit identified in the "unit number" field are included in the transfer.

The "READ BY HOST REFERENCE NUMBER" operation is used to read information from the write logs associated with a specific host. If the "count" field message is zero, the disk controller sets the command's end message "count" field equal to the number of write history entries that are associated with both the host identified in the "host reference number" field and the unit identified in the "unit" field. Therefore, the controller counts only those entries that resulted from writes to the identified unit from the identified host.

If the "count" field in a "READ BY HOST REFERENCE NUMBER" operation is nonzero, the controller transfers the number of write history entries specified in the "count" field to the location in host memory 12 specified in the "write history buffer descriptor" field, beginning with the first write history entry that is associated with both the host identified in the "host reference number" field and the unit identified in the "unit number" field.

As noted above, the end message format for the Write History Management command is shown in FIG. 5B. The "unit alloc" field will contain the total number of write history entries currently allocated and associated with the unit identified in the command message "unit number" field. The "server alloc" field will contain the total number of write history entries currently allocated across every disk served by the particular disk controller. The "server unalloc" field contains the total number of write history entries currently available.

Figure 7A:
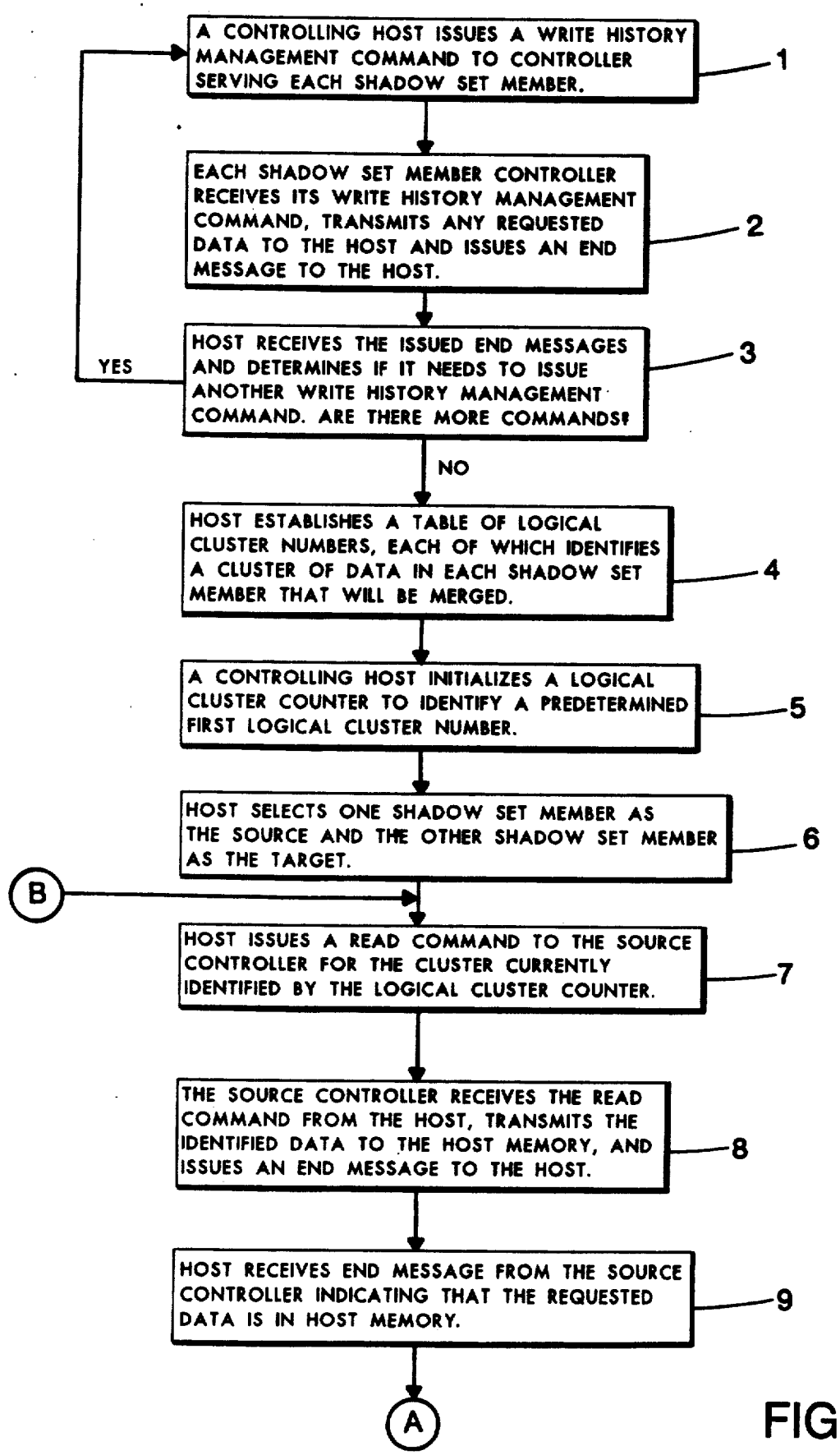
FIGS. 7A, 7B and 7C is a flow chart illustrating a method of merging two members of a shadow set according to a preferred embodiment of the invention.
Figure 7B:
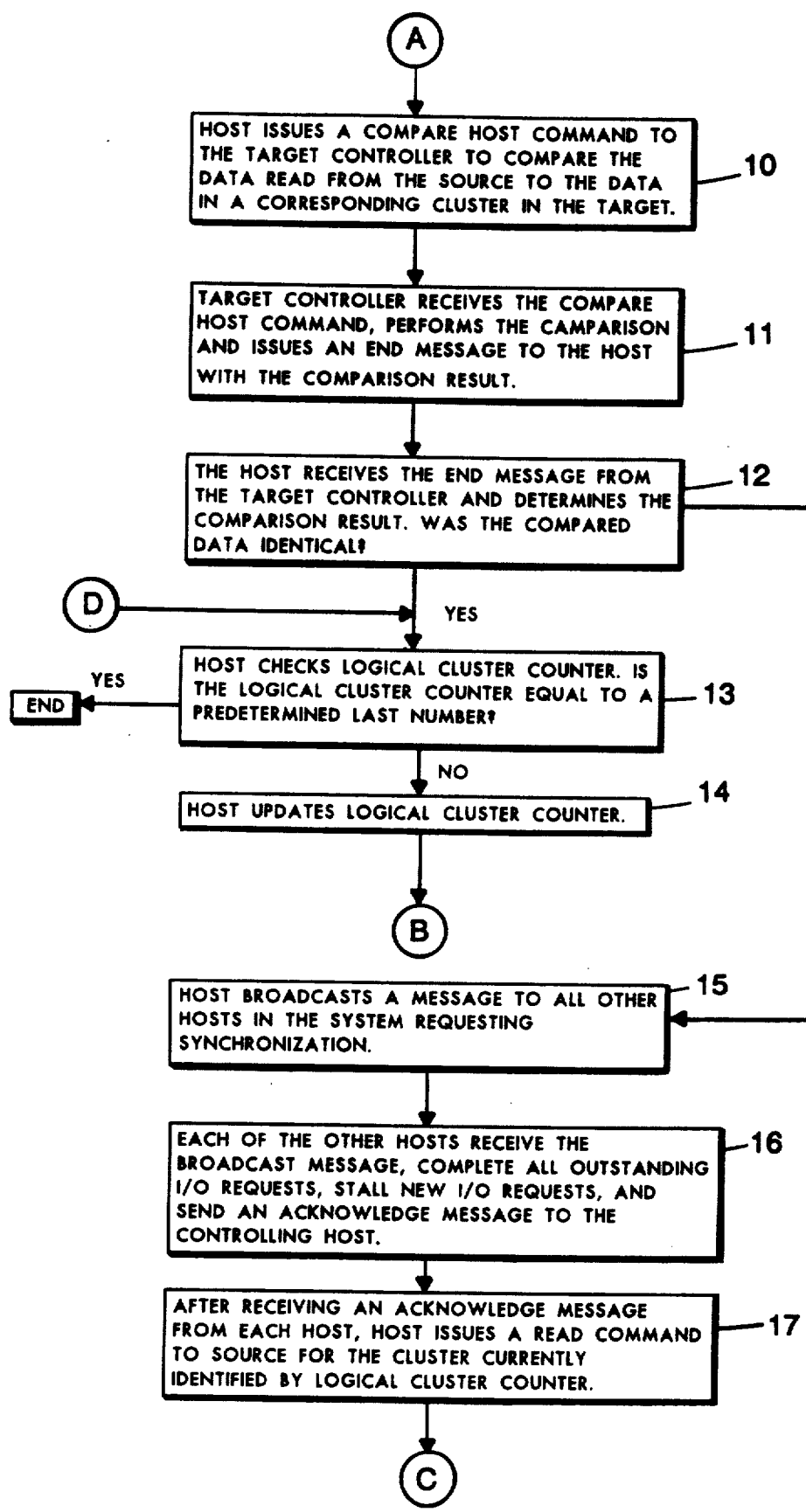
Figure 7C:
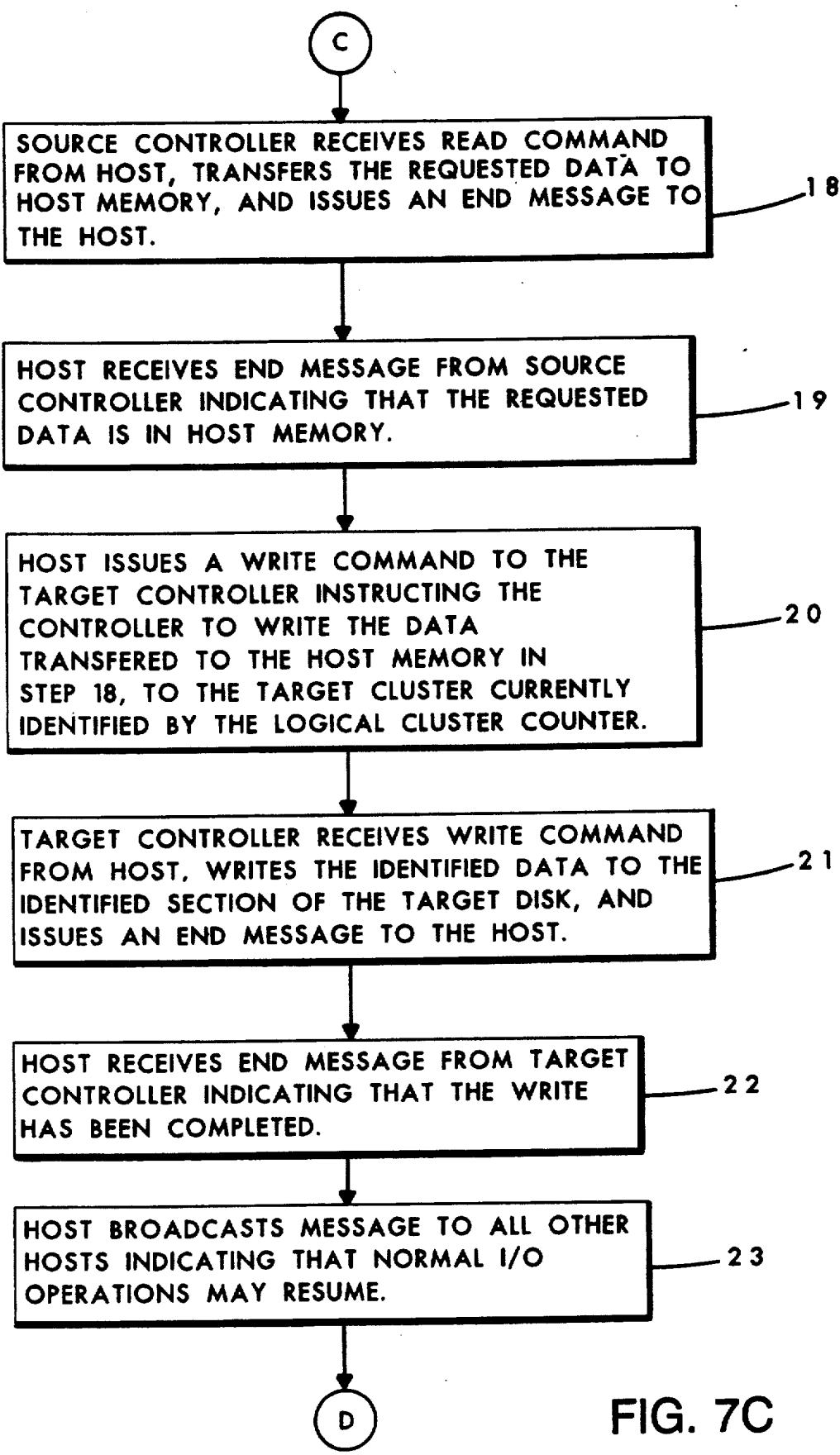

Now that the Write History Management command, and its associated operations, have been described in detail, a merge operation utilizing the write log feature will be described with reference to the flowchart of FIGS. 7A–C.

In step 1, the host issues one of the Write History Management commands described above to each shadow set member in order to obtain information from the write logs stored in memory 26 of each disk controller 18. The specific commands used will depend on the circumstances that created the need for the merge operation. For example, if a host fails, and a merge is performed by one of the properly functioning hosts, the host performing the merge will obtain, from the write log associated with each shadow set member, a complete list of all data blocks on that member disk to which the failed host had performed a write operation. As discussed above, the only data blocks that can possibly be inconsistent are those to which data was written by the failed host.

To obtain this information, the host performing the merge will first issue a Write History Management command to perform a "Read Host Reference Number" operation to each disk controller that supports a shadow set member, with the "count" field set to zero. The command will identify the failed host in the "host reference number" field. As described above, each disk controller will receive its command and will send an end message to the host with the count field set to the total number of write history entries in its write log that were created due to writes from the failed host (step 2).

The host will then determine whether it needs to issue more Write History Management commands (step 3). In this example, the host has received end messages specifying the number of write history entries contained in each write history log for the failed host. The host controlling the merge will therefore need to issue another command to each shadow set member's disk controller that indicated it had write history entries for the failed host. A disk controller that returned an end message with the "count" field set to zero has no write history entries for the failed host and the host does not send a second command to these disk controllers. (Note that in the rare case where every shadow set controller returns a valid end message with the "count" field set to zero, indicating that no shadow set member has been written with data from the failed host, no merge operation is necessary and the process terminates.)

Therefore, a second Write History Management command is sent to each disk controller having needed write history entries (step 1), the command again specifying the "Read by Host Reference Number" operation and identifying the failed host, but this time setting the "count" field to the number of write history entries that the particular write history log has for the failed host. This time each disk controller reads the write history entries from memory 26, sends them to the controlling host's memory 12; and issues an end message (step 2). The host receives the end messages and will determine, in this case, that it does not need to issue another Read By Host Reference Number command since it will now have all of the needed write history information.

The host (step 3) proceeds to establish a Logical Cluster Number table in its memory 12. The table contains numbers that identify the "clusters" (i.e., groups of data blocks) in the shadow set that are to be merged.

The controlling host sets up the table by listing logical cluster numbers that identify all of the clusters that are identified by the write history entries transmitted by the shadow set members.

As each write history entry is received, the host prepares a new entry, each of which is identified by a logical cluster counter (which starts at 1 and increases sequentially). The entry contains a number identifying the cluster to which the data had been written, and a disk controller ID that identifies the disk controller that sent the write history entry. By sequentially going through the logical cluster number table, the host will be able to identify every cluster to which data has been written by the failed host.

The host may discount logical cluster number table entries if they are the result of write history entries where corresponding entries were received from every disk controller supporting a shadow set member, because if a write has been performed in every shadow set member, the shadow set will not be inconsistent due to that write. In other words, since shadow set inconsistencies occur due to a write succeeding on some members but failing on other members, if a write history entry identifying a specific write command can be found in the write log associated with every shadow set member, then we know that the write operation succeeded on every member, and logical cluster numbers formed from these write history entries need not be used.

Next, in step 5, the host sets a logical cluster counter equal to the first logical cluster count number in the logical cluster number table. The logical cluster counter is used to access a logical cluster number. When initialized to one in step 5, the first entry in the logical cluster number table is identified.

The host then selects one of the members as a "source" and the other member as the "target" (step 6). The host issues a read command to the disk controller serving the source to read the data stored in the section of the disk identified by the current logical cluster counter (step 7). The read command issued by the host is described above and shown in FIG. 2B. The "unit number" is set to describe the source disk 20 with the "Logical Block Number" and "Byte Count" being set according to the cluster currently identified by the logical cluster counter.

The source receives the read command and, after reading the identified data from the disk 20 to buffer 22, will transmit the data to the host memory 12 in the section identified by the "Buffer Descriptor" field in the read command. The source will then transmit an end message of the type illustrated in FIG. 4B, which informs the host that the read operation has been performed (step 8).

After the host receives the end message (step 9), the host will issue a Compare Host command to the target controller to compare the data read from the source to the data in the corresponding cluster in the target to determine if the data is identical (step 10).

If a "yes" result is obtained, the host will check to see if the logical cluster counter identifies the last logical cluster number in the logical cluster number table (step 13). If the result of step 13 is "yes", the merge operation is finished. Otherwise, the logical cluster counter is incremented (step 14) and the method returns to step 7 to process the next cluster.

If a no result was returned, indicating that the data read from corresponding clusters on the two merge members are not identical, the host will implement the following steps to make the data consistent.

The host will first establish cross system synchronization by transmitting a message over communications medium 16 to all other hosts in the system (step 15). Each host will receive the transmitted message, will complete all outstanding I/O requests to the shadow set and will stall new I/O requests. Once this has been accomplished, each host sends an "acknowledge" message to the host controlling the merge indicating that it has complied with the synchronization request (step 16).

After receiving all of the acknowledge messages, the host will issue another read command to the source for the same cluster read in step 7, using an identical command message (step 17). The data is read again because another host may have modified the data since it was read in step 7. The source receives the read command message and executes it in the same manner as described in connection with step 8 above (step 18). The host will once again receive the end message from the source as in step 9 above (step 19).

The host will now issue a write command to the target using the write command message format shown in FIG. 2A, and described above (step 20). The write command will instruct the target to write the data read from the source in step 18, to the cluster in the target identified by the logical cluster counter. The target receives the write command, executes it and sends an end message to the host (step 21). These steps will result in the data in the two corresponding clusters in the source and target being consistent. Note that, because no I/O requests are being processed during these steps (i.e., the system is synchronized) there is no danger of the data in the source being modified after it was read in step 18, so the data written to the target's cluster in step 21 will be identical to the data now stored at the corresponding cluster in the source.

After the host receives the end message indicating the write has been completed (step 22), the host transmits a message to all other hosts to end the cross-system synchronization, the message informing all other hosts that normal I/O operations may resume (step 23). The host will then return to step 13 and continue as described above.

Therefore, during a merge operation, the host selects a shadow set member as the source and sequentially compares the data stored in each data block (a cluster at a time) to data in the corresponding data blocks in the target shadow set member. If the host finds an inconsistency, the system is temporarily synchronized while the host resolves the inconsistency by reading the inconsistent data from the source and writing the data to the corresponding cluster in the target. Because the shadow set members being merged normally have only a very small amount of data that is inconsistent, cross system synchronization will be necessary for only a short time, resulting in only minimal disruption to normal I/O operations.

Because the data on both shadow set members is equally valid, if a cluster on the shadow set member selected as the source is corrupted (e.g., cannot be read), the corresponding cluster on the target is utilized. I.e., the target acts as the source for that cluster. Therefore, data transfer in a merge operation can occur in both directions.

If a host in the system needs to perform a read operation while another host is performing a merge as described above, the host must first ensure that the specific location to which the read is directed is consistent. To accomplish this, the host will effectively perform a merge operation on that specific section by first issuing the read to the source and then issuing a Compare Host command to the target to determine if the data is consistent. If it is consistent, then the host continues with its processing of the read data. If it is not consistent, then the host will synchronize the system, reread the data from the source and write the data to the target as described above.

Since there is limited space in each disk controller memory 26 for the write history log, the hosts will try to keep as many write history entries as possible available for use. Therefore, if a host issues a write command to each member of the shadow set, and receives end messages from each disk controller indicating that the write request was successfully performed, the host will reuse the write history entries that were allocated for the write requests sent to each disk controller. These entries may be reused because, if a write has succeeded to all members of the shadow set, then the shadow set will not be inconsistent due to that write. As discussed above, a host that performs a merge operation will deallocate those entries that were used in the merge operation once the operation is completed.

The illustrative embodiment describes a merge operation performed on a single target, but several targets may be used to thereby merge three or more storage media. Similarly, the system need not use the same member disk as the source throughout the merge operation, but may use other disks as the source.

While the illustrative embodiment describes the use of the write history log when performing a merge operation, it should be clearly understood that the write history log need not be used. The advantages of the invention can be achieved without using the write log feature. The merge operation would be carried out for each cluster in the shadow set, or for clusters selected by some means other than the disclosed write history log.

Accordingly, the invention shall not be limited by the specific illustrative embodiment described above, but shall be limited only by the scope of the appended claims.

We claim:

1. A method of managing a shadow set of storage media including a plurality of storage media each being accessible for I/O operations by at least one data processing device, said method comprising the steps of:

A. carrying out successive comparisons of data stored in corresponding locations in a pair of said plurality of storage media while maintaining access to said pair of storage media for I/O operations; and B. performing a management operation on one of said pair of storage media when said comparisons indicate that data in the corresponding locations are not consistent, said management operation comprising:

a. interrupting I/O operations to said one of said pair of storage media;

b. modifying data on said one of said pair of storage media to make data in the corresponding location of said one of said pair of storage media consistent with data in the corresponding location of the other of said pair of storage media; and c. resuming the availability of said one of said pair of storage media for I/O operations.

2. The method of claim 1 wherein said step of modifying comprises reading data from the other of said storage media and writing said read data to said one of said storage media.

3. The method of claim 1 wherein each of said plurality of storage media are accessible by a plurality of data processing devices.

4. The method of claim 1 wherein said step of carrying out successive comparisons comprises comparing only those locations of said storage media which have been written with data since a previous management operation.

5. The method of claim 4 wherein said storage media are divided into data blocks, and wherein at least one of said storage media comprises information indicating which of its blocks have been written with data since the previous management operation.

6. The method of claim 1 wherein said plurality of storage media are each directly accessible by a plurality of data processing devices.

7. The method of claim 1 wherein said management operation is performed only on portions of said at least one of said storage media, said portions selected based on said successive comparisons.

8. The method of claim 7 wherein said storage media are divided into corresponding data blocks, said step of carrying out successive comparisons comprising comparing corresponding data blocks in at least two of said storage media.

9. A method of ensuring consistency of data stored in corresponding data blocks of first and second storage media, said first and second storage media being accessible by at least one host processor for I/O operations, said method comprising the steps of:

(a) reading data stored in a data block in one of said storage media and designating said data block as a current data block;

(b) comparing the data read from said current data block with data stored in the corresponding data block in the other of said storage media;

(c) if the data compared in step b are consistent, reading data stored in a different data block in one of said storage media, designating said different data block as the current data block, and returning to step b;

(d) if the data compared in step b are not consistent, temporarily prohibiting modification of data in said current data block, and modifying the data stored in at least one of the corresponding data block and the current data block so that the data stored in the corresponding data block is consistent with the data stored in the current data block; and (e) reading data stored in a different data block in one of said storage media, designating said different block as the current data block, and returning to step b.

10. The method of claim 9 wherein said different data block is a data block adjacent to said current data block.

11. The method of claim 9 wherein each of said storage media are members of a shadow set of storage media.

12. The method of claim 11 wherein each of said storage media may be directly accessed by at least one host processor.

13. The method of claim 11 wherein each of said storage media may be directly accessed by each of a plurality of host processors.

14. The method of claim 9 wherein said storage media are disk storage devices.

15. The method of claim 9 wherein steps a, c and e comprise reading only those data blocks which have been written with data during a predetermined period of time.

16. The method of claim 15 wherein one of said storage media comprises information indicating which of its blocks have been written with data during said predetermined period of time.

17. A method of ensuring consistency of data stored in corresponding data blocks of first and second storage media, said storage media being accessible by at least one host processor, said method comprising the steps of A. comparing corresponding data blocks on said first and second storage media to identify those blocks that have inconsistent data such that said at least one host processor maintains I/O operations to said first and second storage media; and B. temporarily making at least one of said first and second storage media unavailable to said at least one host processor for I/O operations while modifying the data in at least one data block identified as having inconsistent data in step A so that said corresponding data blocks have consistent data.

18. An apparatus for managing a shadow set of storage media each accessible for I/O operations by at least one data processing device, comprising:

means for carrying out successive comparisons of data stored in corresponding locations in a pair of said plurality of storage media while maintaining access to said storage media for I/O operations; and means for performing a management operation on one of said pair of storage media when said successive comparisons indicate that data in the corresponding locations are not consistent, said management operation comprising:

means for interrupting I/O operations to at least said one of said pair of storage media;

means for modifying data on said one of said pair of storage media to make data in the corresponding location of said one of said pair of storage media consistent with data in the corresponding location of the other of said pair of storage media; and means for resuming the availability of said one of said pair of storage media for I/O operations.

19. The apparatus of claim 18 wherein said plurality of storage media are each directly accessible by a plurality of data processing devices.

20. The apparatus of claim 18 wherein said means for carrying out successive comparisons compares only those locations of said plurality of storage media which have been written with data since a previous management operation.

21. The apparatus of claim 20 wherein said storage media are divided into data blocks, and wherein at least one of said storage media comprises information indicating which of its blocks have been written with data since the previous management operation.

22. The apparatus of claim 18 wherein said means for performing a management operation performs said operation only on portions of said at least one of said storage media, said portions selected based on said successive comparisons.

23. The apparatus of claim 22 wherein said storage media are divided into corresponding data blocks, said means for carrying out successive comparisons comparing corresponding data blocks in at least two of said storage media.

24. In a data processing system that includes a storage medium accessible by at least one data processing device for I/O operations, an apparatus for managing said storage medium, said apparatus comprising:

means for allowing data stored in at least some locations on said storage medium to be compared with other data stored in said data processing system while maintaining access to said storage medium by said at least one data processing device;

means for receiving one or more commands specifying a management operation to be performed on said storage medium to make the data stored in said at least some locations on said storage medium consistent with the data stored in corresponding locations in said data processing system when said comparisons indicate inconsistency between the data stored on said storage medium and the data stored in said data processing system;

means for interrupting I/O operations to said storage medium;

means for executing said received commands; and means for resuming the availability of said storage medium for I/O operations after said commands are executed.

25. The apparatus of claim 24 wherein said received commands comprise write commands.

26. The apparatus of claim 24 wherein said received commands comprise a plurality of commands transmitted from a processor supporting one of said data sources.

27. The apparatus of claim 24 wherein said storage medium is one member in a shadow set of storage media.

28. The apparatus of claim 27 wherein said received commands comprise write commands that contain data read from a second storage medium in said shadow set of storage media.

29. The apparatus of claim 24 wherein said storage medium is directly accessible by a plurality of data processing devices.

30. The apparatus of claim 24 wherein said storage medium is divided into data blocks, and wherein said apparatus further comprises means for storing information indicating which of its blocks have been written with data during a predetermined period of time.

* * * * *